(12) United States Patent
Nakao

(10) Patent No.: US 9,069,537 B2
(45) Date of Patent: Jun. 30, 2015

(54) POWER SUPPLY SWITCHING APPARATUS

(75) Inventor: Hiroshi Nakao, Yamato (JP)

(73) Assignee: FUJITSU LIMITED, Kawasaki (JP)

(*) Notice: Subject to any disclaimer, the term of this patent is extended or adjusted under 35 U.S.C. 154(b) by 304 days.

(21) Appl. No.: 13/608,331

(22) Filed: Sep. 10, 2012

(65) Prior Publication Data
US 2013/0080798 A1 Mar. 28, 2013

(30) Foreign Application Priority Data

Sep. 28, 2011 (JP) ................................ 2011-212470

(51) Int. Cl.
G06F 1/00 (2006.01)
G06F 1/26 (2006.01)
H05K 7/14 (2006.01)
G06F 1/32 (2006.01)

(52) U.S. Cl.
CPC . *G06F 1/263* (2013.01); *G06F 1/32* (2013.01); *H05K 7/1492* (2013.01)

(58) Field of Classification Search
CPC ..................................... G06F 1/32; G06F 1/26
USPC .................................................. 713/300, 324
See application file for complete search history.

(56) References Cited

U.S. PATENT DOCUMENTS

| 7,279,810 B2* | 10/2007 | Nitta .................................. 307/64 |
| 7,495,875 B2* | 2/2009 | Lin ...................................... 361/89 |
| 7,557,463 B2* | 7/2009 | Yoshida ............................ 307/39 |
| 8,036,003 B2* | 10/2011 | Watanabe ......................... 363/50 |
| 2001/0017485 A1* | 8/2001 | Yoo .................................. 307/66 |
| 2004/0125626 A1* | 7/2004 | Kanouda et al. ............... 363/125 |
| 2005/0286925 A1* | 12/2005 | Yoshida ............................ 399/88 |
| 2006/0212137 A1* | 9/2006 | Sone ................................. 700/22 |
| 2008/0197705 A1* | 8/2008 | Dewis et al. ..................... 307/65 |
| 2008/0301476 A1* | 12/2008 | Itakura ............................ 713/300 |
| 2009/0267418 A1* | 10/2009 | Lin et al. ......................... 307/66 |
| 2010/0293395 A1* | 11/2010 | Li et al. ......................... 713/300 |

FOREIGN PATENT DOCUMENTS

| JP | 4-322136 | 11/1992 |
| JP | 2001-264367 | 9/2001 |
| JP | 2002-34177 | 1/2002 |
| JP | 2007-215344 | 8/2007 |
| JP | 2010-282260 | 12/2010 |

OTHER PUBLICATIONS

Japanese Office Action issued Feb. 3, 2015 in corresponding Japanese Patent Application No. 2011-212470.

* cited by examiner

*Primary Examiner* — Jaweed A Abbaszadeh
*Assistant Examiner* — Phil Nguyen
(74) *Attorney, Agent, or Firm* — Staas & Halsey LLP

(57) ABSTRACT

A power supply switching apparatus includes a controller and a switch. The controller includes a first comparator, an integrator circuit and a second comparator. The first comparator is configured to output a binary signal having a level corresponding to a magnitude of a signal input from the power supply being connected thereto. The integrator circuit is configured to integrate an output from the first comparator. The second comparator is configured to output a binary signal having a level corresponding to a magnitude of a single input from the integrator circuit. The switch has an input side connected to the first and the second power supply and is configured to switch an outputting current between a current supplied from the first power supply and a current supplied from the second power supply in accordance with a value of the signal output from the second comparator.

5 Claims, 25 Drawing Sheets

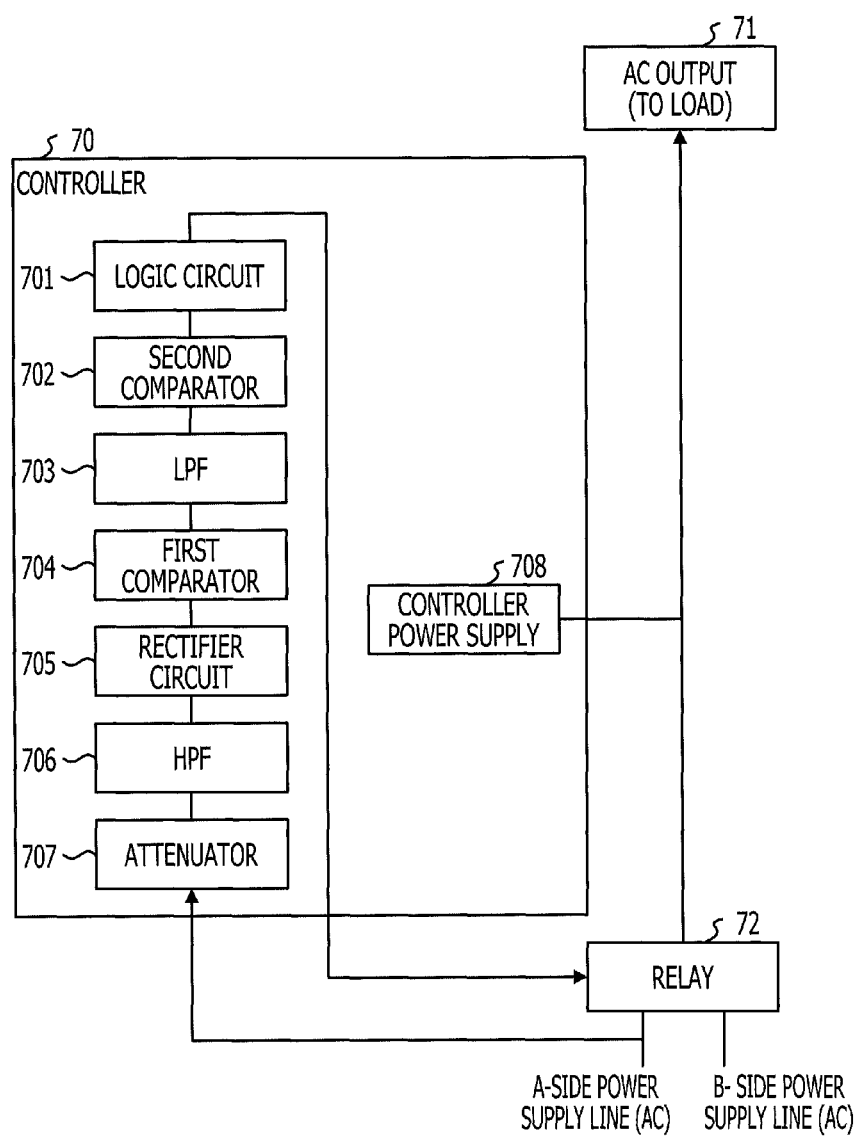

INPUT

RECTIFICATION

INTEGRATION

COMPARISON

SHOT NOISE

INPUT

RECTIFICATION

COMPARISON

INTEGRATION

COMPARISON

POWER SUPPLY SWITCHING APPARATUS

CROSS-REFERENCE TO RELATED APPLICATION

This application is based upon and claims the benefit of priority of the prior Japanese Patent Application No. 2011-212470, filed on Sep. 28, 2011, the entire contents of which are incorporated herein by reference.

FIELD

The embodiments discussed herein are related to a power supply switching apparatus.

BACKGROUND

A data center, where many servers are housed in one location, has become popular in recent years. Because a data center is supposed to house servers in huge quantities with high density, there is a trend toward integrating the redundancy of individual servers from the viewpoint of the relationship between the cost and size.

For example, with the aim of reducing suspension of the service of server devices caused by a power interruption, an uninterruptible power supply (UPS) is used as the server power supply. In this case, typically, a small-capacity UPS is placed on an individual server basis or a rack basis. Alternatively, a plurality of large-capacity UPSs may be placed in a facility, such as a data center, in some cases.

When large-scale UPS devices are used, because one UPS supports an increased number of servers, preferable reliability of the UPS is inevitably higher, as compared with when small-capacity UPSs are used.

One approach to maintaining the reliability of a UPS and ensuring the reliability of a server power supply system is the use of a device called a static transfer switch (hereinafter referred to as "STS"). An STS has two alternating-current power supply input systems as the power supply input; if the power supply input in one system fails, the power input is promptly switched to the other system to continue supplying power to the servers.

FIG. 24 illustrates one example of a server system that uses STSs 241 to 244. In the example illustrated in FIG. 24, servers 280, 284, 285, and 286 include power supply units (PSUs) 245, 246, 247, and 248, respectively. The PSUs 245 to 248 are connected to the respective STSs 241 to 244. In the example illustrated in FIG. 24, because a total of four servers are disposed, the four STSs 241 to 244 in total are disposed.

Each of the STSs 241 to 244 is connected to individually independent power supply systems, that is, an A-side power supply system and a B-side power supply system. In the example illustrated in FIG. 24, the A side is the main power supply system, and the B side is an auxiliary power supply system. If the main power supply system goes down, the STSs 241 to 244 switch the power supply system to an auxiliary system, that is, B-side system to avoid the effects on the server.

FIG. 25 illustrates a schematic configuration of an STS. An STS 250 includes relay switches 253 and 254 disposed therein. The relay switches 253 and 254 include internal coils 252 and 255, respectively. Each of the relay switches 253 and 254 is activated by a controller 251 controlling the coils 252 and 255 and switches the power supply system supplying power the server to one of the A side and B side power supply systems. For example, if the A-side power supply system goes down in the state where the power is supplied from the A-side power supply system, the controller 251 detects this down and controls the relay switches 253 and 254. The control by the controller 251 causes the relay switches 253 and 254 to be switched from the A side to B side, and the power is supplied from the B-side power supply system to a server 256.

UPSs in a data center are typically placed in one specific location of a building. In this case, the wiring between the PSU/STS and the server is long, and that is disadvantages in the cost or easiness of maintenance.

Examples of Patent Literature that discloses a technique relating to a power supply device are listed below.

Japanese Laid-open Patent Publication No. 2001-264367, Japanese Laid-open Patent Publication No. 2002-034177, and Japanese Laid-open Patent Publication No. 2007-215344 are examples of related art.

To protect a server from the effects of an instantaneous power interruption, the power is preferably switched at or below the half cycle of an alternating current. When the frequency of AC power is 60 Hz, the half cycle corresponds to 8 ms; when that is 50 Hz, the half cycle corresponds to 10 ms.

When a semiconductor relay, which generally can operate at high speed, is used in an STS, the PSU can be switched in a period of approximately 1 ms from detection of an instantaneous interruption. In this case, however, there is a problem in that the device is relatively expensive. If the semiconductor relay breaks down, the apparatus moves to a short circuit mode, and thus the STS preferably includes a protective circuit.

In contrast, a mechanical relay is relatively inexpensive, but the length of time of switching is typically at least approximately 5 ms, and this switching time is too long for achieving the switching at or below the half cycle.

SUMMARY

According to an aspect of the invention, a power supply switching apparatus for switching a power supply for supplying power to a load between a first power supply and a second power supply, includes a controller and a switch. The controller includes a first comparator, an integrator circuit and a second comparator. The first comparator is connected to either one of the first power supply and the second power supply and is configured to output a binary signal having a level corresponding to a magnitude of a signal input from the power supply being connected thereto. The integrator circuit is configured to integrate an output from the first comparator. The second comparator is configured to output a binary signal having a level corresponding to a magnitude of a single input from the integrator circuit. The switch has an input side connected to the first power supply and the second power supply and is configured to switch an outputting current between a current supplied from the first power supply and a current supplied from the second power supply in accordance with a value of the signal output from the second comparator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates the configuration of a power supply switching apparatus that includes two comparators;

DESCRIPTION OF EMBODIMENTS

Figure 1:
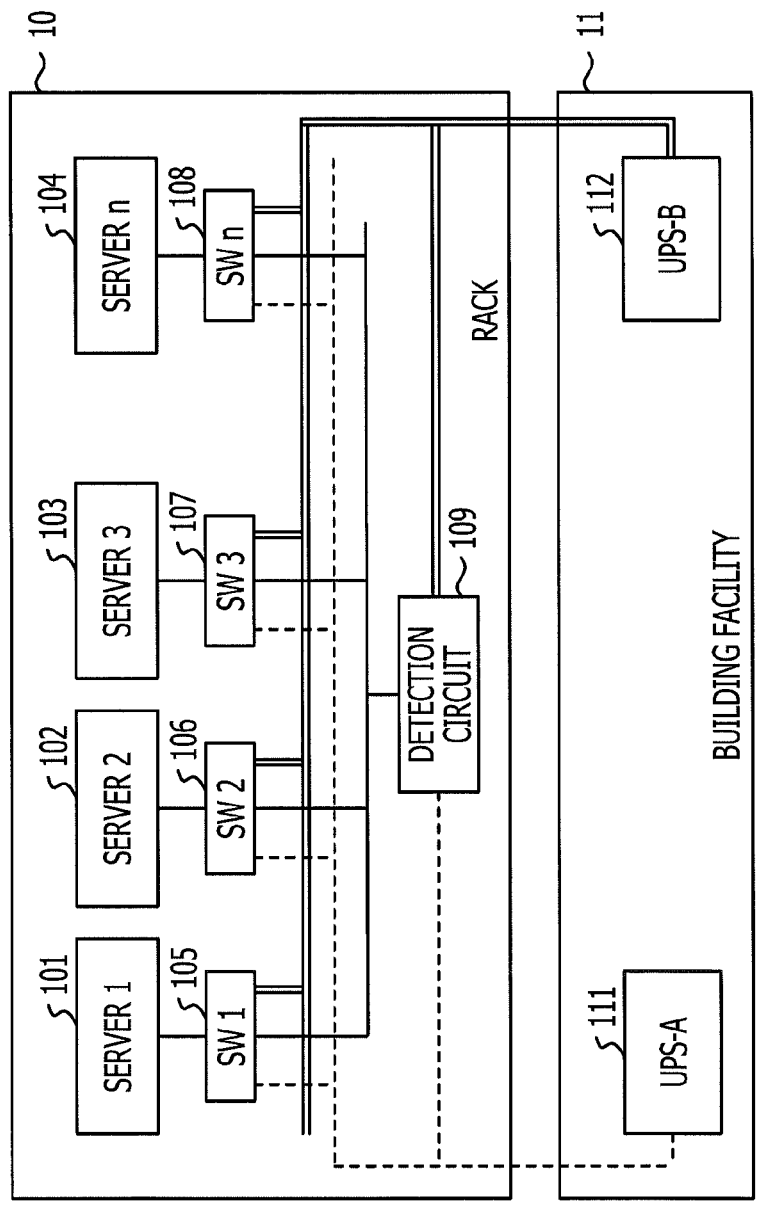
FIG. 1 illustrates the configuration of an information processing system according to an embodiment.

FIG. 1 illustrates the configuration of an information processing system according to an embodiment.

The information processing system illustrated in FIG. 1 illustrates a system that includes a plurality of servers 1 to n (101 to 104).

Each of the servers illustrated in FIG. 1 receives power supplied from two UPSs of a UPS-A 111 and a UPS-B 112. The information processing system further includes switches 105 to 108 corresponding to the servers 101 to 104, respectively. Each of the switches 105 to 108 is configured to switch the UPS supplying power to the server between the UPS-A and UPS-B.

The information processing system illustrated in FIG. 1 further includes a detection circuit 109 configured to detect an operating state, specifically, a voltage of each UPS. The detection circuit is connected to both the UPS-A and UPS-B and sends, to switches SW1 to SWn, a signal instructing each of the switches SW1 to SWn to be switched to the UPS-A side or UPS-B side in accordance with the detected state of the UPS. Each of the switches SW1 to SWn is switched to the UPS-A side or UPS-B side on the basis of the signal from the detection circuit.

In the example illustrated in FIG. 1, the plurality of servers 1 to n are placed in a rack 10. The switches SW1 to SWn and the detection circuit 109 are also placed in the rack 10. In contrast, both the UPS-A and UPS-B are placed in a building facility 11 outside the rack 10, such as a building that houses the rack 10.

In the example illustrated in FIG. 1, the plurality of switches share the single detection circuit, and detection circuits corresponding to the respective servers are not included.

Figure 2:
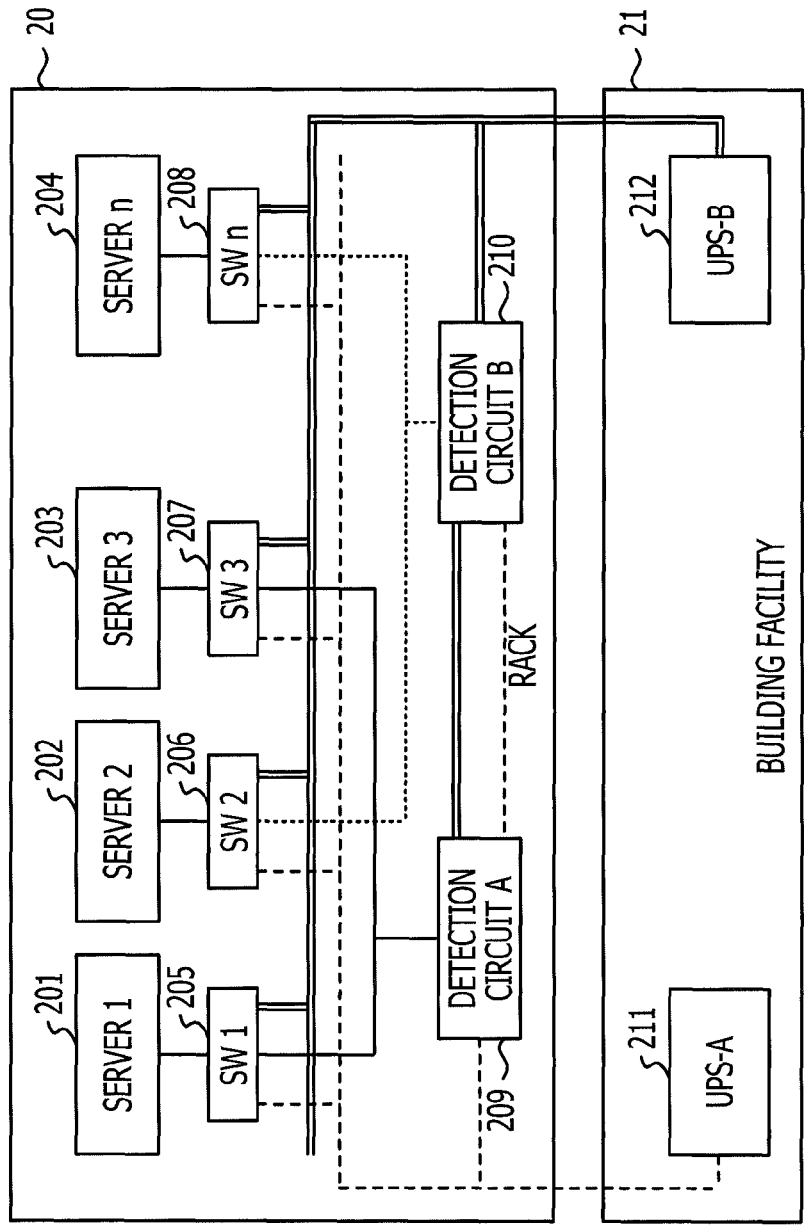
FIG. 2 illustrates one variation of the information processing system.

FIG. 2 illustrates one variation of the information processing system. Of the elements illustrated in FIG. 2, common elements to those in FIG. 1 are not described here. In the example illustrated in FIG. 2, the information processing system includes two detection circuits. The detection circuits monitor voltages of different UPSs. Specifically, a detection circuit A 209 is connected to a UPS-A 211 and monitors the voltage thereof, whereas a detection circuit B 210 is connected to a UPS-B 212 and monitors the voltage thereof. The detection circuits are connected to each other and exchange their own states with each other.

In the example illustrated in FIG. 2, the detection circuit A 209 and the detection circuit B 210 are connected to different switches. The detection circuit A 209 is connected to switches SW1 (205) and SW3 (207) and controls the on and off of these switches. The detection circuit B 210 is connected to switches SW2 (206) and SWn (208) and controls the on and off of these switches.

Each of the detection circuits controls the switches such that the number of servers to which each UPS supplies power is balanced at 50% of the rating of the UPS in a steady state. When the detection circuit detects a down of the UPS whose voltage is monitored by that detection circuit, the detection circuit switches the switch corresponding to the servers to which the UPS being down supplies power and enables the other UPS to supply power thereto.

Figure 3:
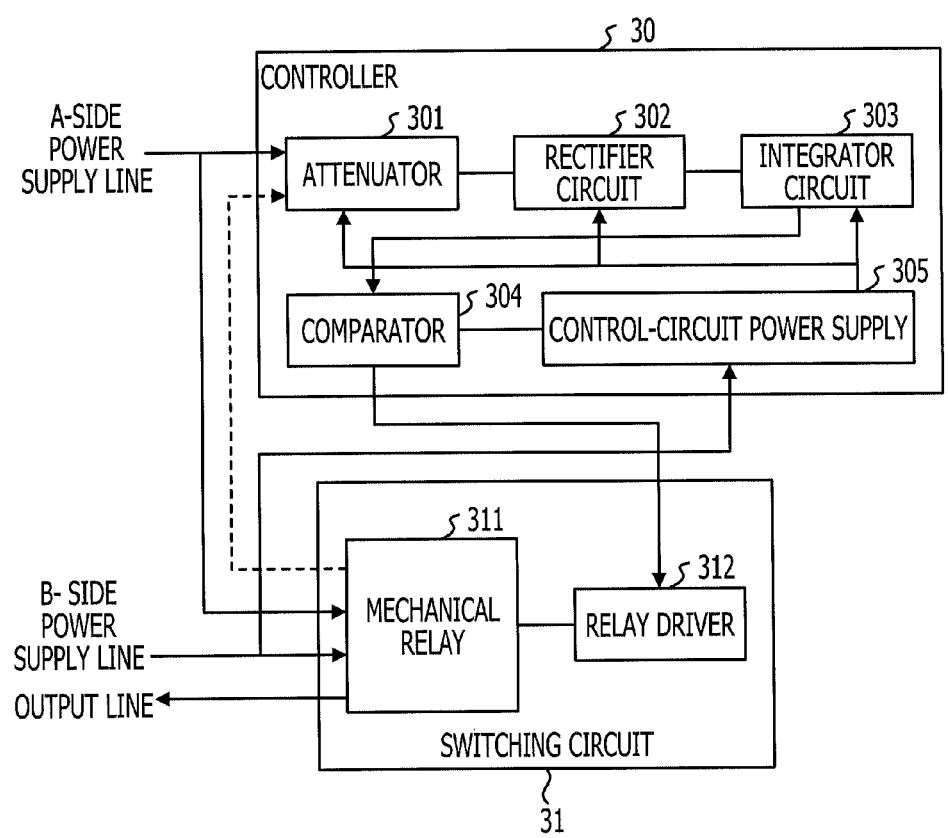
FIG. 3 illustrates the configuration of a controller and a switching circuit.
Figure 4A:
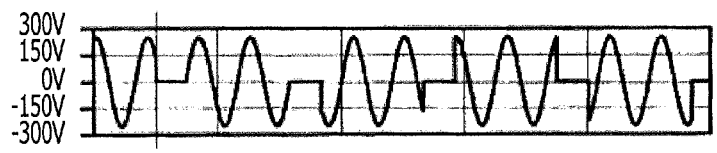
FIGS. 4A to 4E illustrate signal waveforms in sections of the controller and the switching circuit illustrated in FIG. 3.
Figure 4B:
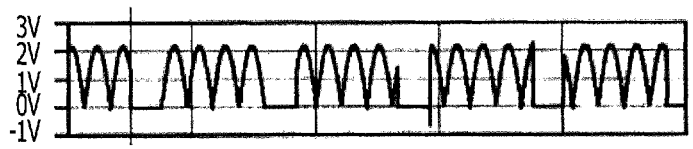
Figure 4C:
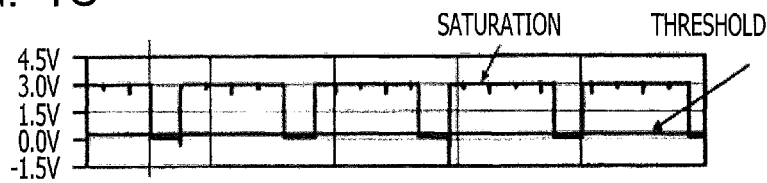
Figure 4D:
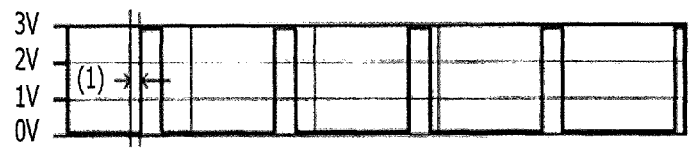
Figure 4E:
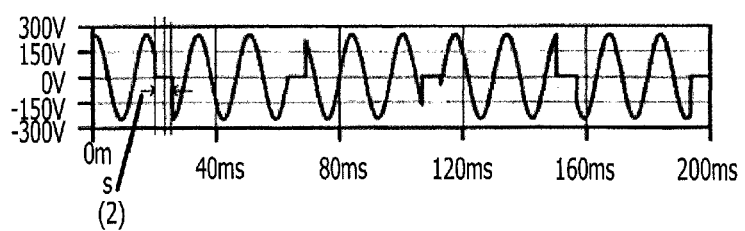

FIG. 3 illustrates a detection circuit (controller) 30 and a switching circuit (switch) 31 according to the present embodiment. FIGS. 4A to 4E illustrate signal waveforms in the sections of the circuitry illustrated in FIG. 3. FIG. 4A illustrates a waveform of a signal input through the A-side power supply line, FIG. 4B illustrates a waveform of an output from a rectifier circuit, FIG. 4C illustrates a waveform of an output from an integrator circuit, FIG. 4D illustrates a waveform of a trigger output from the switching apparatus, and FIG. 4E illustrates a waveform of an output from the switching apparatus.

FIG. 3 illustrates an example in which two alternating-current power supplies, the A-side power supply and B-side power supply, are included, power is supplied from the A-side power supply to the server in a steady state, and the B-side power supply is used as an auxiliary power supply.

As illustrated in FIG. 3, the controller 30 according to the present embodiment includes an attenuator 301, a rectifier circuit 302, an integrator circuit 303, and a comparator 304. The controller 30 further includes a control-circuit power supply 305 configured to supply power to the above elements.

In the example illustrated in FIG. 3, the controller 30 is connected to the line from the A-side power supply. In the example illustrated in FIG. 4A, there are lacks in the waveform of a signal input from the A-side power supply line. The lacks indicate the state where an instantaneous interruption occurs.

The power supply voltage input through the A-side power supply line is attenuated by the attenuator 301, and the attenuated voltage is input to the rectifier circuit 302. The rectifier circuit 302 outputs a signal indicating the absolute value of the input alternating-current power, as illustrated in FIG. 4B. In the example illustrated in FIG. 4B, the signal output from the rectifier circuit is output as a signal having a positive value.

The signal output from the rectifier circuit 302 is input into the integrator circuit 303, and a single integrated as illustrated in FIG. 4C is output. As illustrated in FIG. 4C, the output from the integrator circuit is continuously saturated. The signal output from the integrator circuit 303 is a signal that indicates whether the power supply voltage is being supplied through the A-side power supply line, in other words, whether the A-side power supply is operating or down. In the example illustrated in FIG. 4C, the signal output from the integrator circuit 303 is 0 V in the locations corresponding to the portions where the waveform of the signal input through the A-side power supply line lacks.

The signal output from the integrator circuit 303 is input to the comparator 304. The comparator 304 compares the input signal with the threshold illustrated in FIG. 4C and outputs a signal having a binary value, 1 or 0, as a switching signal. In the example illustrated in FIG. 3, when the level of the input signal is high, a signal having the value 0 is output; when the level of the input signal is low, a signal having the value 1 is output.

The switching circuit 31 includes a mechanical relay 311 and a relay driver 312. In the example illustrated in FIG. 3, the driver is a mechanical driver. The mechanical relay 311 is connected to the A-side power supply line and B-side power supply line as the input and is connected to the output line connected to a server and the like as the output.

The relay driver 312 switches the connection of the mechanical relay 311 to one of the A-side power supply line and B-side power supply line depending on the value of a switching signal output from the comparator 304 in the controller 30. In a steady state, that is, in a state where the A-side power supply is operating, the mechanical relay 311 is switched to the A-side power supply line. The trigger output from the switching apparatus illustrated in FIG. 4D corresponds to the waveform of a switching signal output from the comparator 304 in the controller 30 to the relay driver 312. The trigger output from the switching apparatus is output within 2 ms from the down of the A-side power supply, as illustrated in (1) in FIG. 4D. That is, it indicates that the controller 30 can detect the down of the A-side power supply within 2 ms.

The relay driver 312 having received the switching signal switches the connection of the mechanical relay 311. The waveform of the output from the switching apparatus illustrated in FIG. 4E indicates the waveform of the signal output from the switching apparatus in which switching from the A-side power supply to the B-side power supply is considered. When the A-side power supply is down, the signal output from the switching apparatus is temporarily at 0 V, and as illustrated in (2) in FIG. 4E, the relay is switched to the B-side power supply within 8 ms from the down of the A-side power supply and the power supply for supplying power to the server and the like can be restored.

In the circuit illustrated in FIG. 3, because the integrator circuit 303 is continuously saturated, switching the relay at or below the half cycle of a power supply signal can be enabled by detection of a decrease of an output from the integrator circuit 303.

An operating power for use in the control-circuit power supply 305 in the controller 30 is supplied through the output line of the switching circuit 31. Thus, if the A-side power supply is down, the power can also be stably supplied to the control-circuit power supply 305 by switching of the relay to the B-side power supply.

Figure 5A:
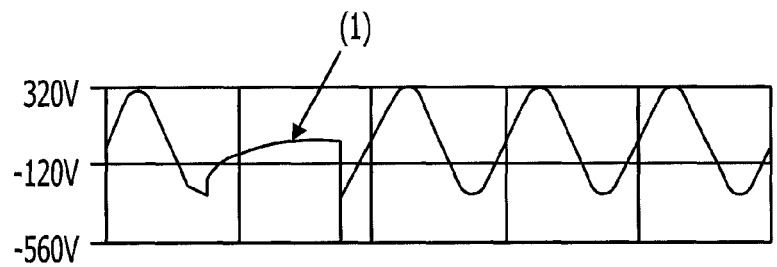
FIGS. 5A to 5D illustrate signal waveforms in the sections of the controller and the switching circuit illustrated in FIG. 3 when noise occurs.
Figure 5B:
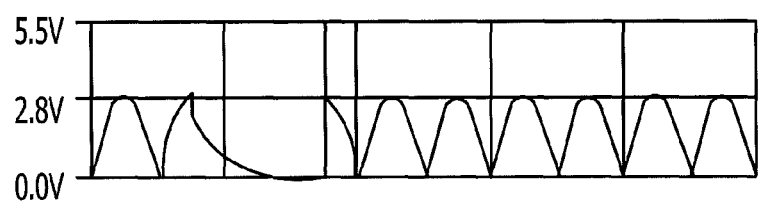
Figure 5C:
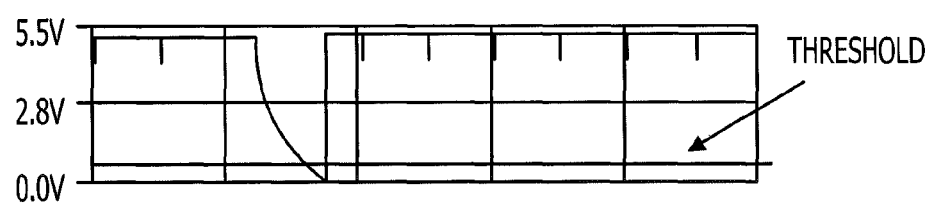
Figure 5D:
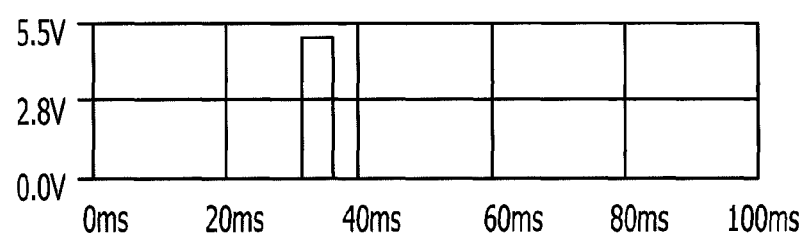

FIGS. 5A to 5D illustrate signal waveforms in the sections of the controller and the switching circuit illustrated in FIG. 3 when noise occurs. FIG. 5A illustrates a waveform of a signal input through the A-side power supply line, FIG. 5B illustrates a waveform of an output from the rectifier circuit, FIG. 5C illustrates a waveform of an output from the integrator circuit, and FIG. 5D illustrates a waveform of a trigger output from the switching apparatus.

In the example illustrated in FIG. 3, the output line of the switching circuit 31 and the control-circuit power supply 305 are electrically connected. Thus, if noise occurs when the A-side power supply is down, the noise flows backward into the controller 30 through the output line and the mechanical relay 311. The dotted lines in FIG. 3 indicate how a current flows backward. The waveform of an input from the A-side power supply illustrated in FIG. 5A indicates the waveform in the state where noise from the control-circuit power supply 305 flows backward. The portion (1) of the waveform illustrated in FIG. 5A corresponds to the backward noise. When a current flows backward into the controller 30 although the A-side power supply is down, the output from the rectifier circuit 302 changes as illustrated in FIG. 5B. The output from the rectifier circuit 302 changes more gently than that in FIG. 4B. Thus, the output from the integrator circuit 303 changes as illustrated in FIG. 5C, and the time when the output from the integrator circuit 303 is at or below the threshold is behind that illustrated in FIG. 4C. Accordingly, as illustrated in FIG. 5D, there may be a problem in which the time when the switching signal is output to the relay driver 312 is delayed and the time of switching the relay is delayed.

Figure 6:
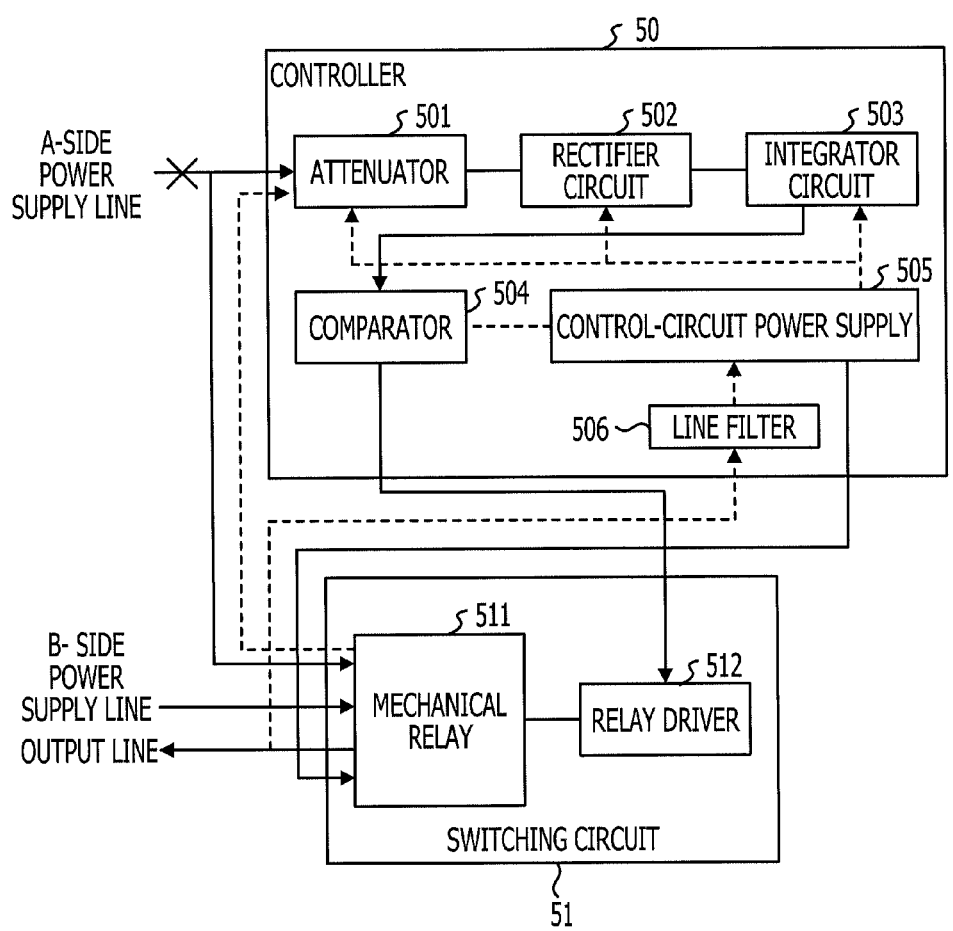
FIG. 6 illustrates one variation of the controller.
Figure 8A:
FIGS. 8A to 8E illustrate signal waveforms in sections of a controller that includes a single comparator.
Figure 8B:
Figure 8C:
Figure 8D:
Figure 8E:
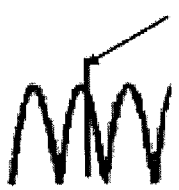

FIG. 6 illustrates one variation of the controller for reducing the effects of noise. In the circuitry illustrated in FIG. 6, a line filter 506 is disposed on the line connecting a control-circuit power supply 505 and a switching circuit 51, and the effects of noise occurring in the control-circuit power supply 505 can be reduced.

FIG. 7 illustrates the configuration of a power supply switching apparatus that includes a controller according to another embodiment. A controller 70 illustrated in FIG. 7 is the element corresponding to the controller illustrated in each of FIGS. 3 and 6. The alternating current switched between the two systems, the A side system and B side system, by a relay 72 is input into the controller 70 illustrated in FIG. 7 and is output as an AC output.

The controller 70 illustrated in FIG. 7 includes an attenuator 707, a high-pass filter 706, a rectifier circuit 705, a first comparator 704, a low-pass filter 703, a second comparator 702, and a logic circuit 701. The controller 70 illustrated in FIG. 7 further includes a controller power supply 708 configured to supply power to each section in the controller 70. The controller power supply 708 receives power supplied through the output line of the relay 72.

Unlike the detection circuit illustrated in FIG. 3, the controller 70 illustrated in FIG. 7 includes a plurality of comparators. The reasons are described below.

FIGS. 8A to 8E illustrate signal waveforms in the sections of a controller that includes a single comparator as a comparative example. In this comparative example, an input signal is rectified by the rectifier circuit, the rectified signal is integrated by the integrator circuit (corresponding to a low-pass filter), and the integrated signal is binarized using the comparator. Shot noise occurring in switching the relay is input into the controller. Thus, in particular, when the relay is returned from the B-side power supply to the A-side power supply, chattering occurs.

The controller 70 illustrated in FIG. 7 includes two comparators and achieves improved resistance to occurring shot noise.

Figure 9A:
FIGS. 9A to 9E illustrate signal waveforms in sections of the power supply switching apparatus including two comparators.
Figure 9B:
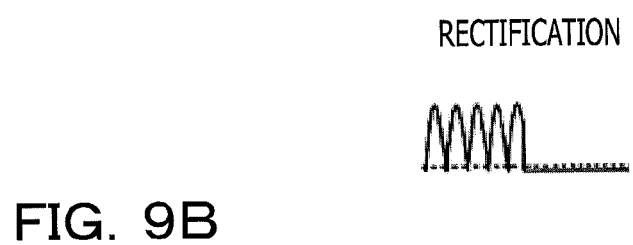
Figure 9C:
Figure 9D:
Figure 9E:
Figure 10:
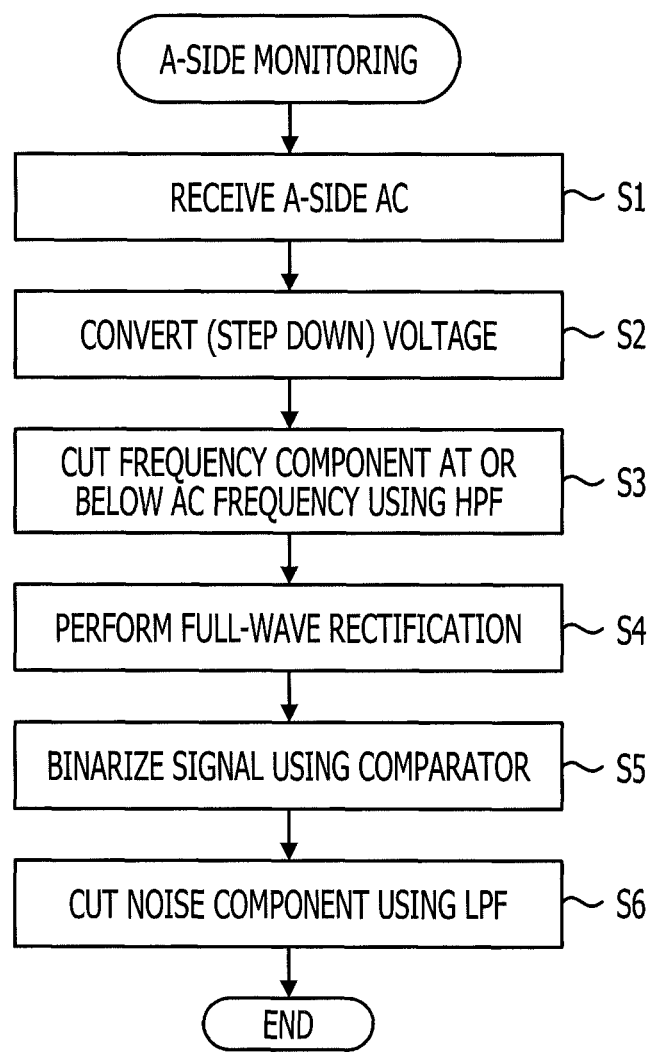
FIG. 10 is a flowchart that describes an operation of the controller as a processing procedure.

FIGS. 9A to 9E illustrate signal waveforms in the sections of the circuitry illustrated in FIG. 7. The details are described below using FIGS. 7 and 9A to 9E. FIG. 10 is a flowchart of an operation of the controller 70 in the form of a processing procedure.

The attenuator 707 in the controller 70 is connected to the A-side power supply line as an input. FIG. 9A illustrates a signal input into the attenuator 707. The attenuator 707 steps down an AC input signal input through the A-side power supply line in S1 illustrated in FIG. 10 (S2). The frequency component at or below the AC frequency in the input signal stepped down by the attenuator 707 is reduced by the high-pass filter 706 (S3). After that, the signal is subjected to full-wave rectification by the rectifier circuit 705 as illustrated in FIG. 9B (S4) and the rectified signal is input into the first comparator 704.

The first comparator 704 outputs a binary signal having a value corresponding to the voltage value of the input signal (S5). In the example illustrated in FIG. 7, the first comparator 704 outputs a low-level signal when the voltage of the input signal is at or above a predetermined value and outputs a high-level signal when the voltage of the input signal is below the predetermined value. The dotted line in the rectified waveform illustrated in FIG. 9B indicates the threshold value for the first comparator 704. As illustrated in FIG. 9C, the level of the output from the first comparator 704 is high when the voltage of the rectified signal is at or above the threshold and is low when the voltage of the rectified signal is below the threshold.

The signal binarized by the first comparator 704 is input into the low-pass filter 703, that is, the integrator circuit. The low-pass filter 703 integrates the input signal, and its noise component is reduced as illustrated in FIG. 9D (S6). Then, the output from the integrator circuit is input into the second comparator 702.

The second comparator 702 outputs a high-level signal when the voltage of the input signal is at or above the threshold and outputs a low-level signal when the voltage of the input signal is below the threshold. The dotted line in the waveform of the output from the integrator circuit illustrated in FIG. 9D indicates the threshold voltage for the second comparator 702.

After that, the output from the second comparator 702 is input into the relay 72 through the logic circuit 701. The relay 72 is switched to one of the A-side power supply line and B-side power supply line in accordance with the signal output from the controller 70 illustrated in FIG. 9E. In the example illustrated in FIG. 7, the relay 72 is switched to the A-side power supply line when the level of the output from the controller 70 is low and is switched to the B-side power supply line when it is high.

Figure 11:
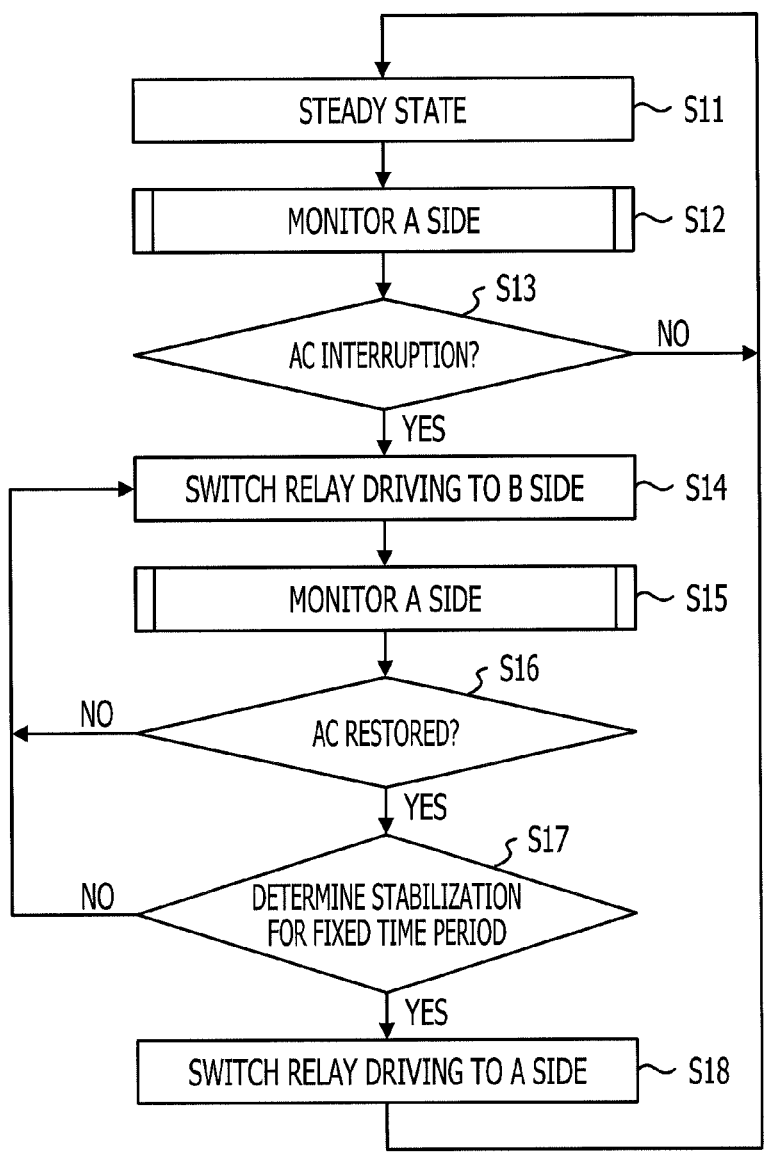
FIG. 11 is a flowchart that illustrates an operation of the power supply switching apparatus.

FIG. 11 is a flowchart that illustrates an operation of the circuitry illustrated in FIG. 7.

In a steady state, the controller 70 monitors a voltage in the A-side power supply line (S11, S12). This operation is described above with reference to FIGS. 7, 9A to 9E, and 10.

As a result of the monitoring of the A-side power supply line, when an interruption of the AC input through the A-side power supply line is detected (YES in S13), the controller 70 outputs, to the relay 72, a signal that instructs the relay 72 to be switched from the A-side power supply line to the B-side power supply line (S14). In this way, the relay 72 is switched to the B-side power supply line, and the power is supplied through the B-side power supply line to the server.

After that, the controller 70 continuously monitors a voltage in the A-side power supply line (S15). When the AC supply through the A-side power supply line is restored (YES in S16), it is determined whether the operation is stable after a lapse of a fixed period of time from the restoration of the A-side power supply (S17). When it is determined that the operation is stable (YES in S17), the controller 70 then outputs a switching signal to the relay 72 (S18). In response to receipt of the switching signal, the relay 72 is switched from the B-side power supply line to the A-side power supply line, and the power supply through the A-side power supply line to the server is restored.

When stability is not determined (NO in S17), no switching signal is output to the relay 72. Thus, the state in which the power is supplied from the B-side power supply to the server remains.

The example illustrated in FIG. 7 illustrates an example in which an analog circuit is used. Alternatively, the functions of the controller may be performed in part by digital processing.

Figure 12:
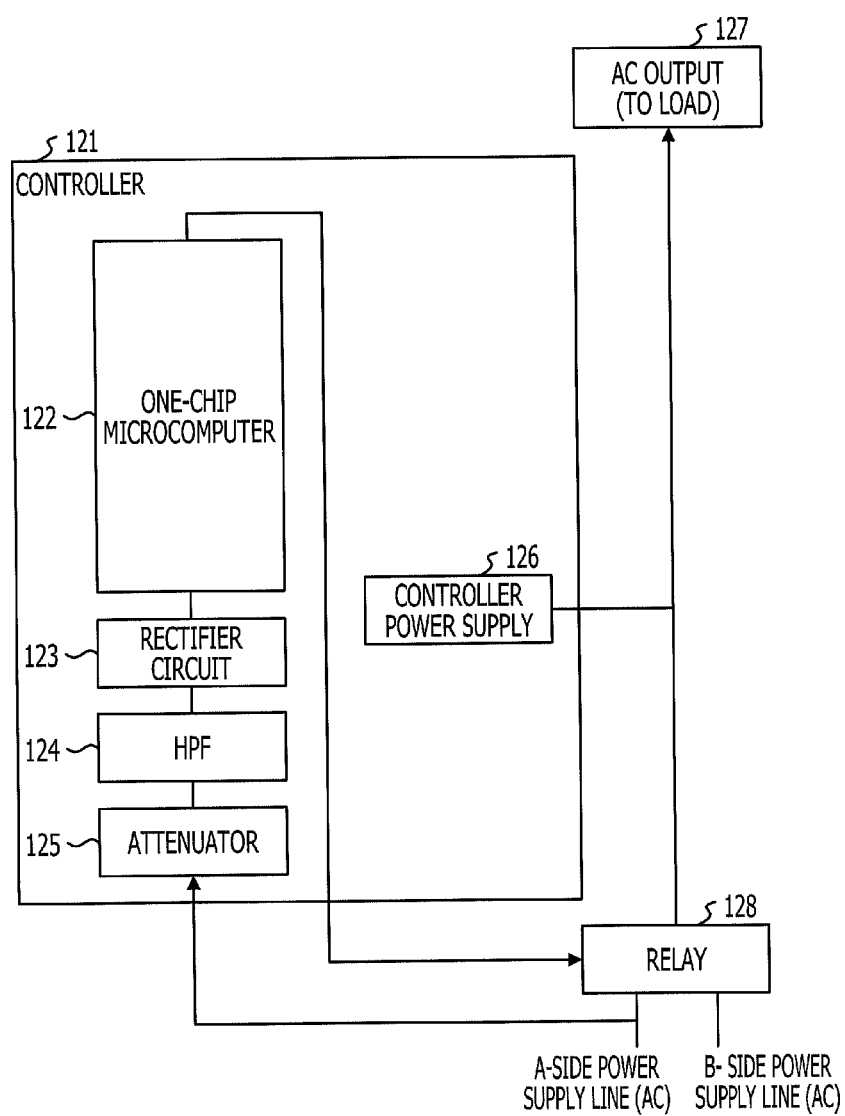
FIG. 12 illustrates the configuration of a power supply switching apparatus that includes a controller that uses a one-chip microcomputer.

FIG. 12 illustrates the configuration of a controller when part of the functions is replaced with digital processing. In the example illustrated in FIG. 12, a one-chip microcomputer is disposed after the rectifier circuit.

Figure 13:
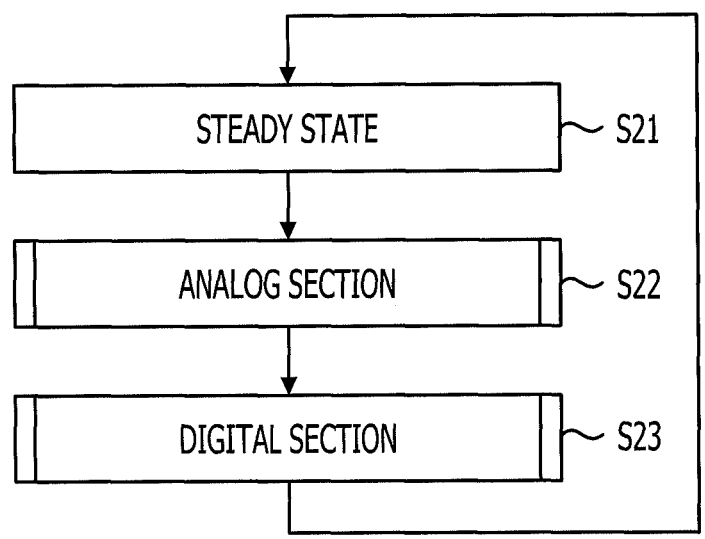
FIG. 13 is a flowchart that illustrates an operation of the power supply switching apparatus.

FIG. 13 illustrates schematic processing of a controller 121 illustrated in FIG. 12. Of the elements of the controller 121 illustrated in FIG. 12, an attenuator 125, a high-pass filter 124, and a rectifier circuit 123 operate in an analog manner. First, the analog section performs processing (S22). After that, a one-chip microcomputer 122, that is, the digital section performs processing (S23).

Figure 14:
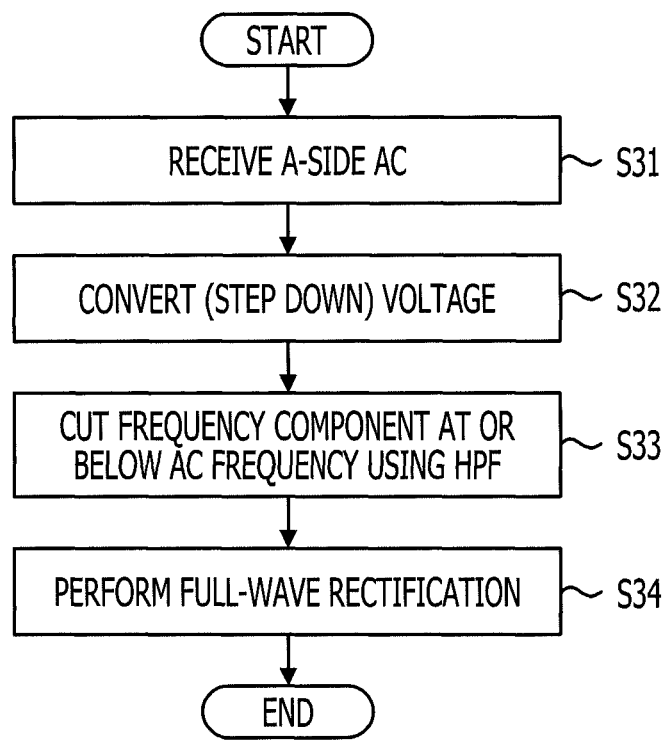
FIG. 14 is a flowchart that illustrates an operation of an analog section.

FIG. 14 illustrates a procedure of an operation by the analog section in the form of a flowchart. In the circuitry illustrated in FIG. 12, a signal input into the controller 121 is stepped down by the attenuator 125 (S32), the frequency component at or below the AC frequency is reduced by the high-pass filter 124 (S33), and the signal is then subjected to full-wave rectification by the rectifier circuit 123 (S34). This operation is substantially the same as that of the circuitry illustrated in FIG. 7.

Figure 15:
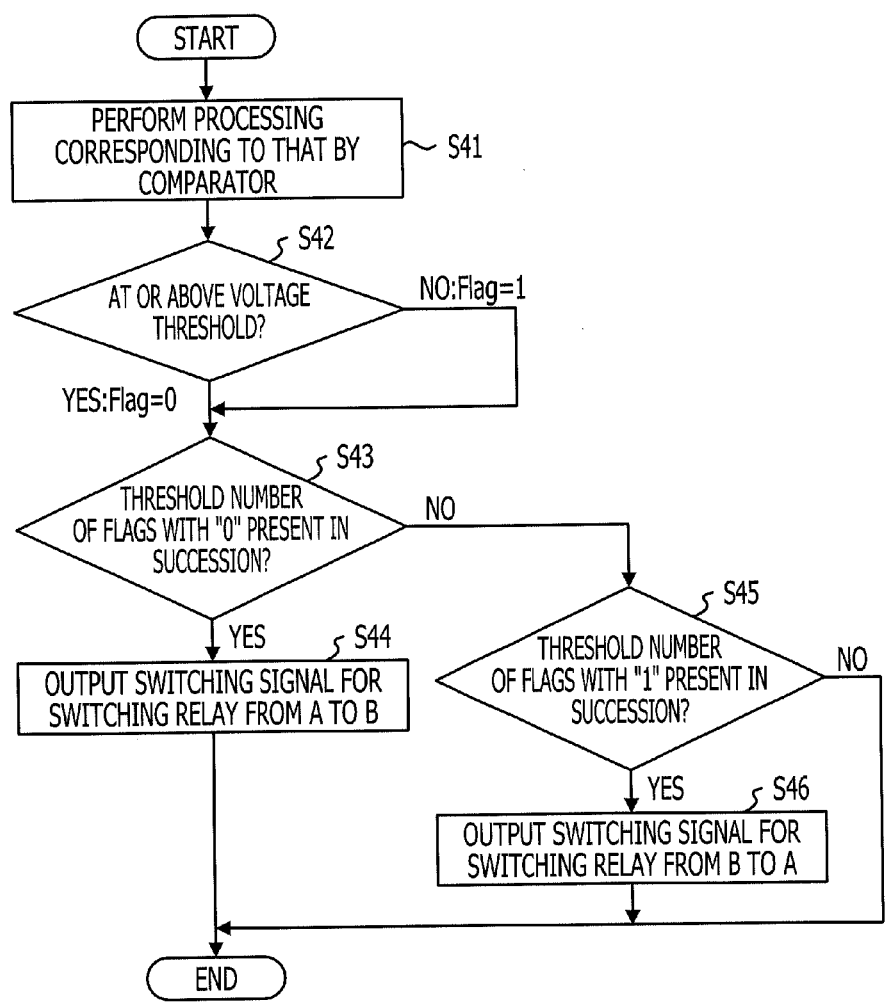
FIG. 15 is a flowchart that illustrates an operation of a digital section.

FIG. 15 is a flowchart that illustrates a processing procedure by the one-chip microcomputer 122 being the digital section in the circuitry illustrated in FIG. 12. In the example illustrated in FIG. 12, a program for executing the processing illustrated in FIG. 15 is set in advance in the one-chip microcomputer 122. Although not illustrated, a memory that stores a program for causing the one-chip microcomputer 122 to perform the processing illustrated in FIG. 15 may be disposed outside the one-chip microcomputer 122.

When receiving a signal, the one-chip microcomputer 122 samples the input signal and then performs processing corresponding to that by a comparator thereon (S41). As the processing by the comparator, as in the case of the circuitry illustrated in FIG. 7, when the level of the input signal is high, a low-level signal is output; when the level of the input signal is low, a high-level signal is output.

Subsequently, it is determined on the basis of the output low-level signal or high-level signal whether the signal is at or above the threshold (S42). When the output signal is at or above the threshold (YES in S42), the flag with the value "0"

is set; when the output signal is below the threshold (NO in S42), the flag with the value "1" is set. The state where the flag value is "0" indicates that the voltage of the signal from the A-side power supply decreases.

The one-chip microcomputer 122 performs processing for determining the flag value (S43). This processing determines whether a threshold number of flags with the value "0" are present in succession, in other words, whether the state where the signal output from the A-side power supply decreases continues for a predetermined period of time or more.

When the threshold number of flags with the value "0" are present in succession (YES in S43), the A-side power supply is determined to be down, and a switching signal that instructs a relay 128 to be switched from the A-side power supply to the B-side power supply is output from the controller 121 to the relay 128 (S44).

When the threshold number of flags with the value "0" are not present in succession (NO in S43), it is determined whether a threshold number of flags with the value "1" are present in succession (S45). When the threshold number of flags with the value "1" are present in succession in the state where the A-side power supply is down (YES in S45), the A-side power supply can be determined to be restored. In this case, a switching signal for switching from the B-side power supply to the A-side power supply is output from the controller 121 to the relay 128 (S46).

When the threshold number of flags with the value "1" are also not present in succession (NO in S45), the processing ends, and a switching signal for switching a relay operation is output from the controller 121 to the relay 128 in accordance with the subsequent flag determination.

Figure 16:
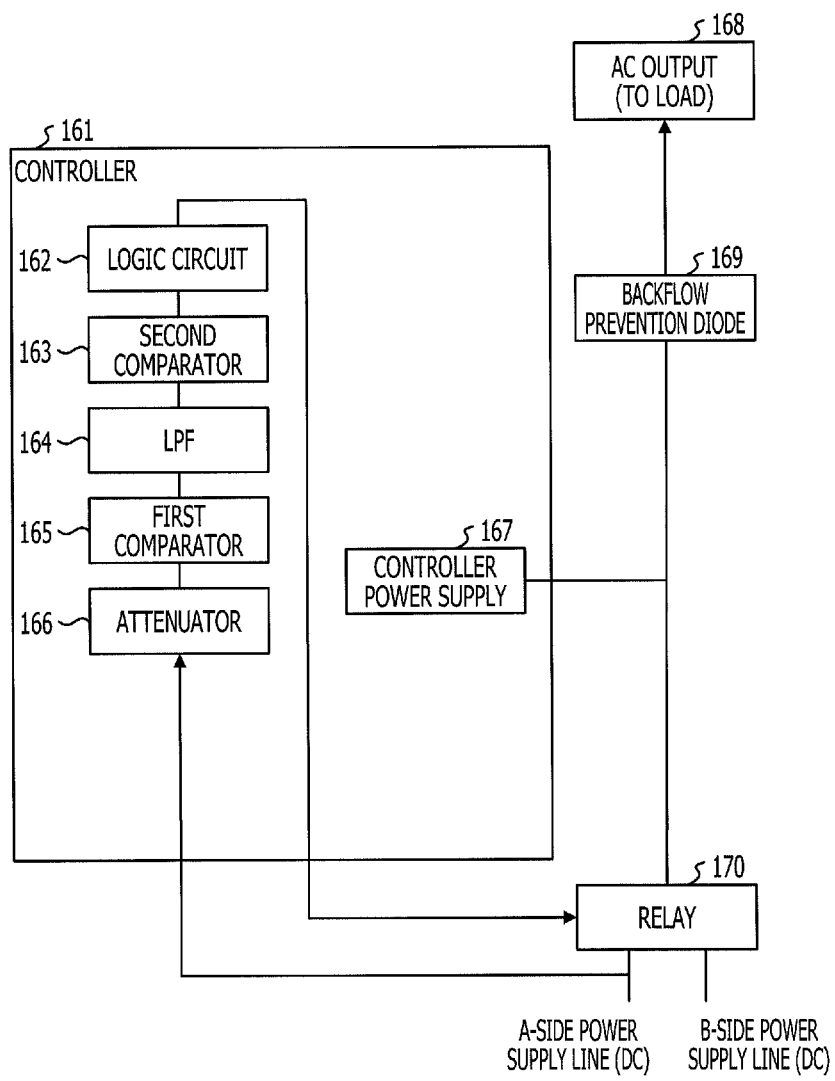
FIG. 16 illustrates the configuration of a power supply switching apparatus connected to direct-current power supplies.

FIG. 16 illustrates another variation of the power supply switching apparatus according to the embodiment.

The circuitry illustrated in FIG. 16 illustrates an example of the configuration of a controller 161 and peripheral circuits when the supplied power is a direct current. A relay 170 illustrated in FIG. 16 is connected to two DC power supply lines of the A-side power supply line and B-side power supply line. The controller 161 is connected to the A-side power supply line.

Because the example illustrated in FIG. 16 uses a DC power supply, the controller 161 does not include a rectifier circuit for rectifying an alternating-current signal and a high-pass filter for reducing a low frequency component. A signal input into the controller 161 is stepped down by an attenuator 166, and then the signal is supplied as a switching signal to the relay 170 through a first comparator 165, a low-pass filter 164, a second comparator 163, and a logic circuit 162, as in the case of the circuitry illustrated in FIG. 7.

When the power supply system is switched, a current may flow backward from a power supply circuit in a load. Because the example illustrated in FIG. 16 uses a direct-current power supply, such a current backflow can be reduced by the addition of a backflow prevention diode 169 between the relay 170 and the load.

Figure 17:
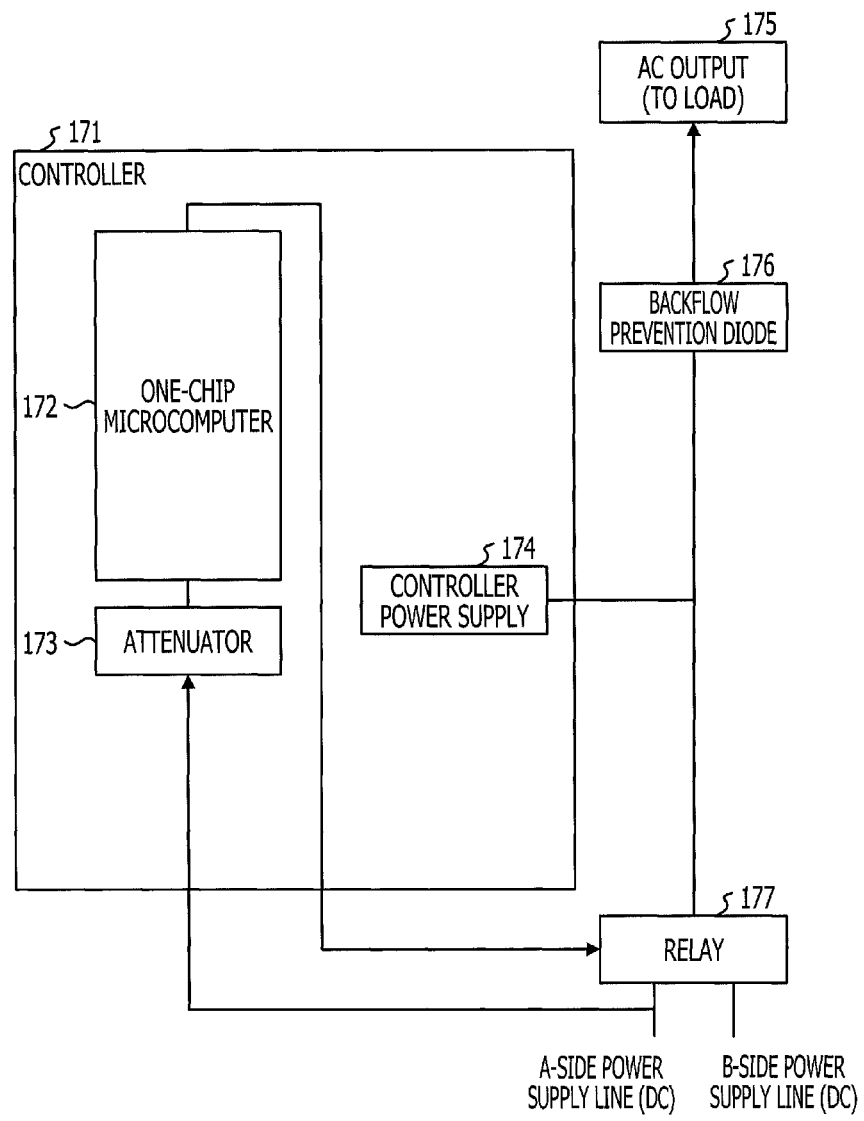
FIG. 17 illustrates the configuration of a power supply switching apparatus capable of reducing a backflow.

FIG. 17 illustrates a variation of the circuitry illustrated in FIG. 16. In the circuitry illustrated in FIG. 17, the functions of the first comparator 165, low-pass filter 164, second comparator 163, and logic circuit 162 illustrated in FIG. 16 are performed by a one-chip microcomputer 172 executing digital processing. The one-chip microcomputer 172 operates in substantially the same way as in the one-chip microcomputer 122 illustrated in FIG. 12.

Figure 18:
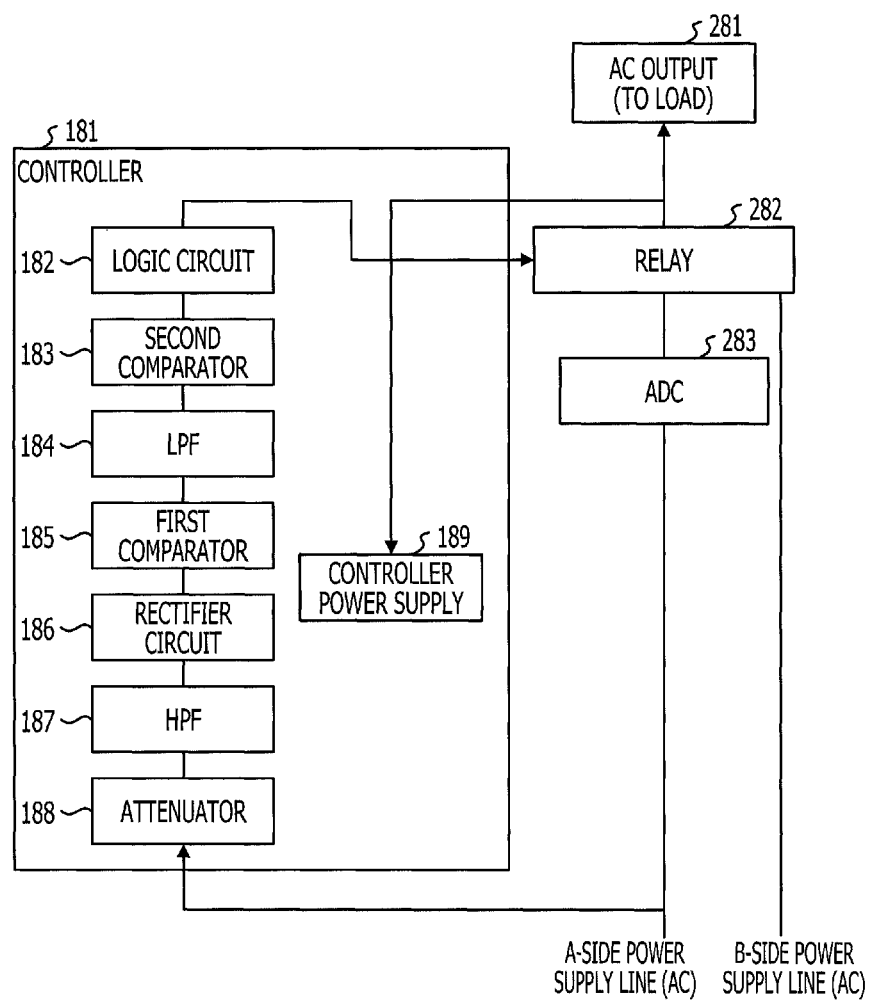
FIG. 18 illustrates the configuration of another power supply switching apparatus capable of reducing a backflow.

FIG. 18 discusses circuitry according to still another variation and illustrates an example in which a relay 282 is connected to the alternating-current A-side power supply line and the direct-current B-side power supply line as an input. In a steady state, a current through the A-side power supply line is converted into a direct current by an AC-to-DC converter 283, and the current is supplied to the load through the relay 282. The B-side power supply line is used as an auxiliary power source and can be connected to a battery, for example. If power supplied through the A-side power supply line is interrupted, the relay 282 is switched to the B-side power supply line. In this way, a direct current supplied through the B-side power supply line is supplied to the load through the relay 282. The operation of a controller 181 is substantially the same as that of the controller 70 illustrated in FIG. 7.

Figure 19A:
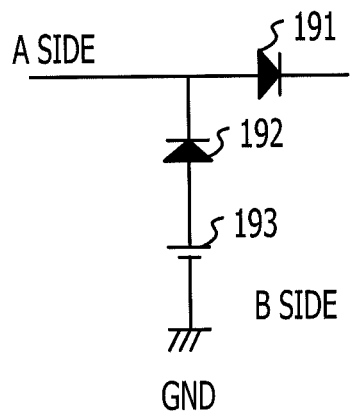
FIGS. 19A and 19B illustrate examples of the configuration of a power supply switching apparatus connected to an AC power supply and a DC power supply.
Figure 19B:
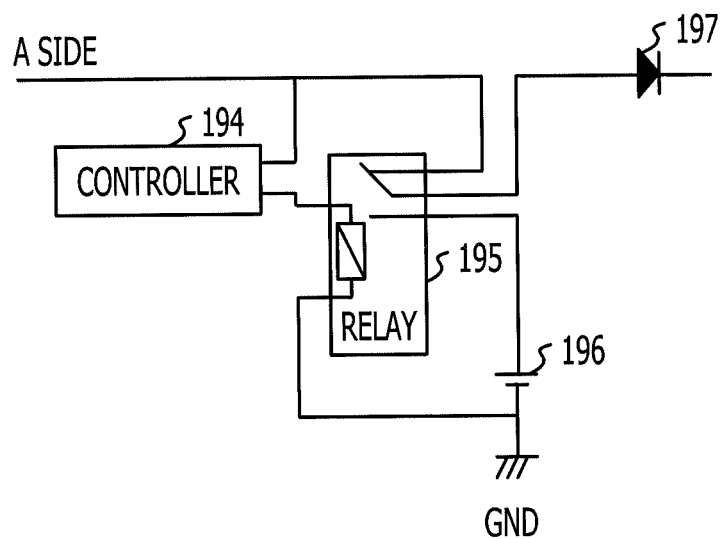

FIGS. 19A and 19B illustrate examples of circuitry that uses both an alternating-current power supply and a direct-current power supply. FIG. 19A illustrates an example that uses a diode OR circuit. FIG. 19B illustrates an example that uses an STS circuit.

In FIGS. 19A and 19B, the battery corresponds to the B-side power supply illustrated in FIG. 18. In the example illustrated in FIG. 19A, the battery, which is the B-side power supply, is connected to the load through the diode. A backflow prevention diode 191 is connected before the load. In the circuitry illustrated in FIG. 19A, if a voltage from the A side decreases and the voltage from the B side becomes larger than the voltage from the A side, power is immediately supplied from the battery to the load.

Because the example illustrated in FIG. 19A employs merely a diode, the number of components of the circuitry is small. However, because the battery, which is the B-side power supply, is connected to the load through the diode, a voltage drop caused by the diode may occur.

Even if the A-side power supply is not down, the voltage of the A-side power supply may vary. In this case, power is supplied from both the A-side power supply and B-side power supply. Because the battery is virtually connected to the load, the battery may be naturally discharged. Thus the example illustrated in FIG. 19A includes a secondary cell or a charging circuit.

In contrast, in the example illustrated in FIG. 19B, an STS circuit is used in switching the power supply system. Thus the number of components in the circuitry illustrated in FIG. 19B is larger than that in FIG. 19A. However, because the circuitry illustrated in FIG. 19B does not use a diode, only the contact resistance of the relay can be the element for causing a voltage loss. Because the example illustrated in FIG. 19B uses a relay, the A-side power supply line and B-side power supply can be isolated from each other. Thus when the A-side power supply operates properly, exhaustion of the battery being the B-side power supply can be suppressed, and the life expectancy of the battery is estimated to be longer than that in the circuitry illustrated in FIG. 19A. Accordingly, the circuitry illustrated in FIG. 19B can use a primary cell depending on the situation.

Figure 20:
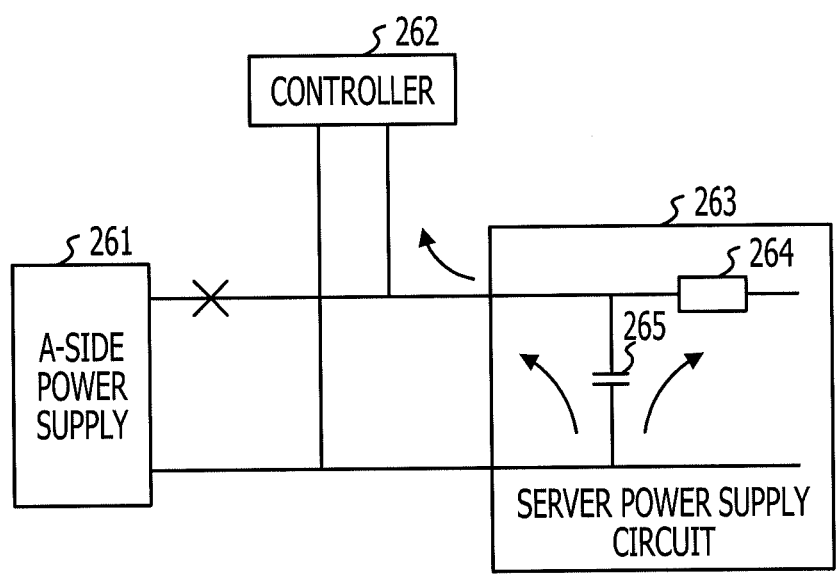
FIG. 20 illustrates a backflow of a current from a server.

FIG. 20 illustrates how a current from a power supply circuit in a server as a load flows backward. In FIG. 20, the relay is not illustrated.

A controller 262 is disposed between an A-side power supply 261 and a server power supply circuit 263. The controller 262 is configured to monitor a voltage of the A-side power supply 261. The server power supply circuit 263 includes an input capacitance 265 and an inductance 264. When power is supplied to the server under normal conditions, the power is stored in the input capacitance 265 and the inductance 264 in the server power supply circuit 263. If the A-side power supply 261 is down and does not supply power to the server, the power stored in the input capacitance 265 and the inductance 264 in the server power supply circuit 263 may flow backward into the controller 262.

If a current flows backward into the controller 262, because the voltage value to be detected by the controller 262 is not immediately 0 V, incorrect detection by the controller 262 may occur, the controller 262 may be unable to detect an interruption of the power supply even when the A-side power supply 261 is down, and switching the relay may be delayed.

The controller 262 steps down an input voltage using an attenuator, and an output from the attenuator is substantially stabilized. Thus, for a high output state, where a voltage supplied from the A-side power supply is high, the voltage value of a backflow current based on the power stored in the input capacitance 265 and the inductance 264 in the server power supply circuit 263 is lower than the peak voltage value. Accordingly, the effects of delay in switching the relay caused by incorrect detection by the controller 262 is not so large (FIG. 21B).

In contrast, for a low output state, because an input voltage is originally low, the voltage value of a backflow current is relatively large. Accordingly, the effects of the backflow current on an operation of monitoring a voltage by the controller are large (FIG. 21A).

Figure 21:
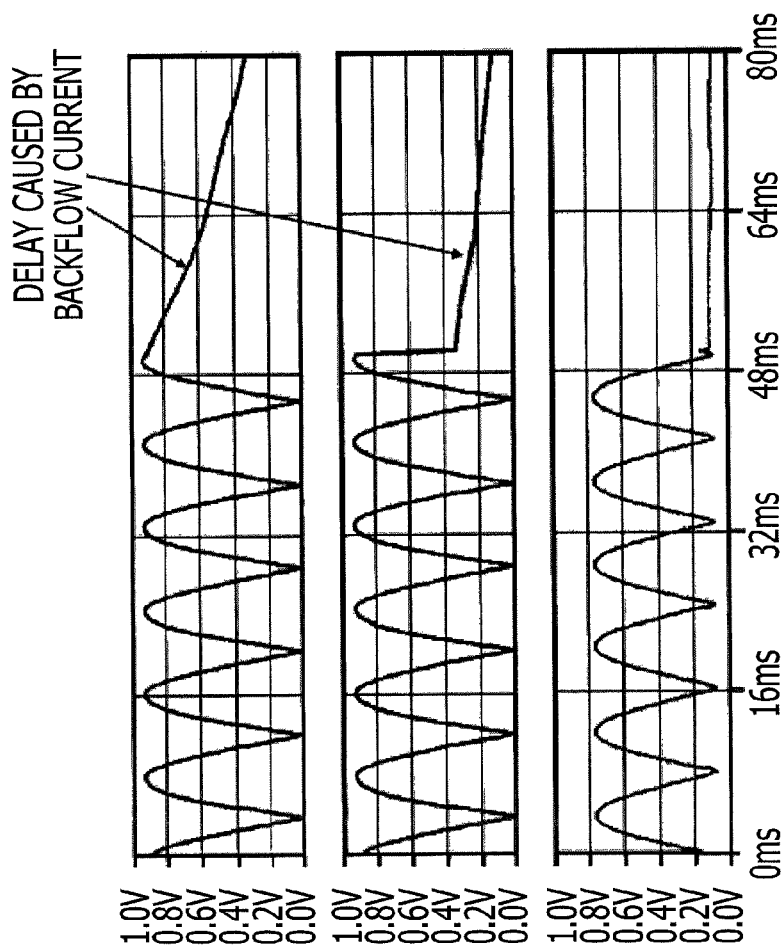
FIGS. 21A to 21C illustrate effects of a current backflow.

One approach to reducing such effects of the backflow current can be the use of a high-pass filter disposed on the input side of the controller (FIG. 21C). However, the use of the high-pass filter may raise an issue of increased power consumption. Thus, it is important to specify the characteristics of the high-pass filter so as to balance the effects of delay in switching in a low output state and the increase in power consumption caused by the use of the high-pass filter in consideration of the correlation between them. Identifying an appropriate high-pass filter may change depending on the device supplying power and the used environment, so the detailed characteristics are not described here.

Figure 22:
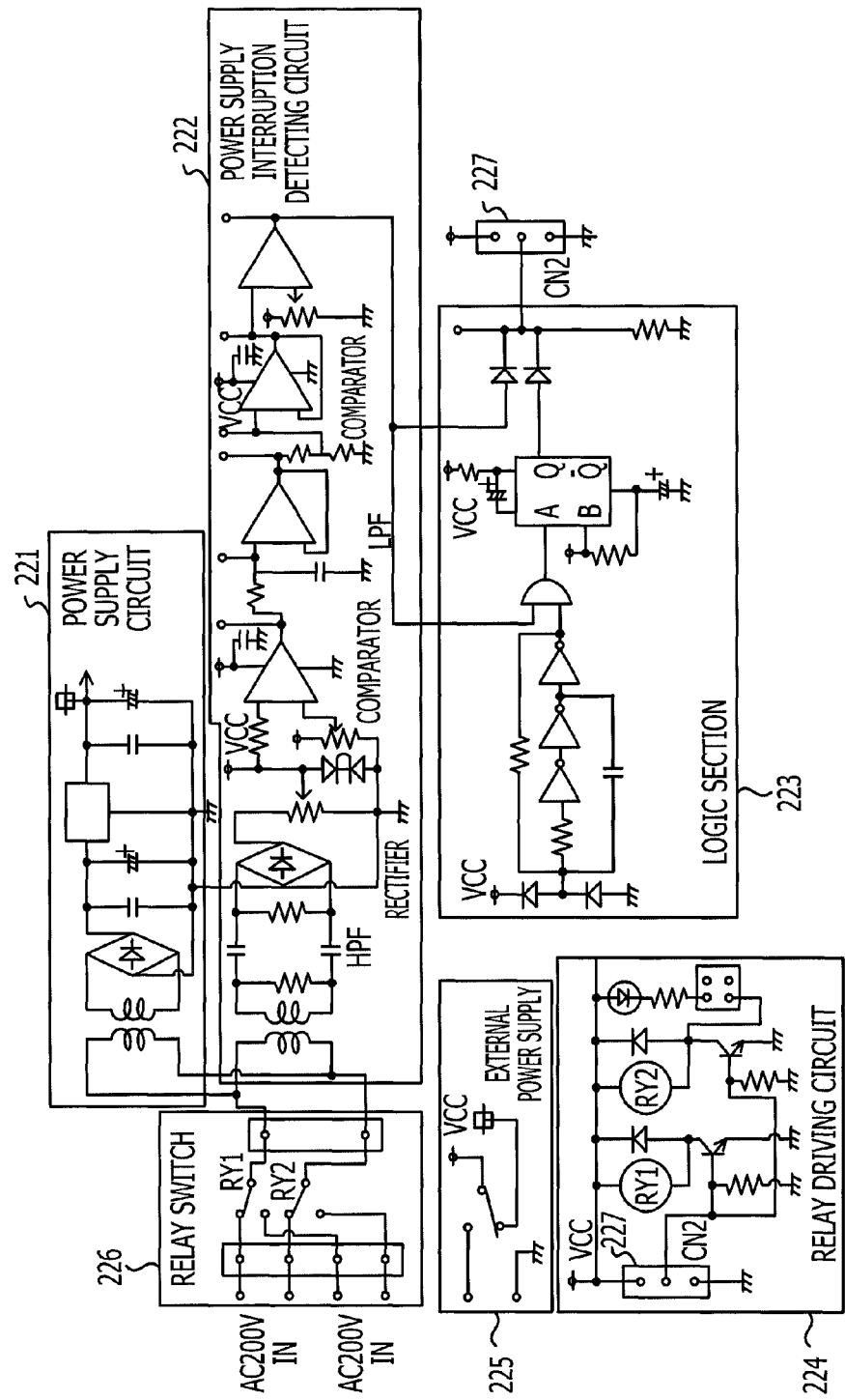
FIG. 22 illustrates an example of circuitry of a power supply switching apparatus and other sections.

FIG. 22 illustrates an example of the circuit configuration of each section. The apparatus described above can be achieved using the circuit configuration illustrated in FIG. 22, for example.

A relay switch 226 receives an alternating current of 200 volts from two systems. The relay switch 226 includes relays RY1 and RY2 and switches a current input into a power supply circuit. Under normal conditions, the relay is switched to the power system in the upper position in FIG. 22.

A current output through the relay switch 226 is supplied to a load, such as a server, through a power supply circuit 221. The output from the relay is also input into a power supply interruption detecting circuit 222. The power supply interruption detecting circuit 222 corresponds to the controller 70 illustrated in FIG. 7 in the embodiment described above, for example.

The power supply interruption detecting circuit 222 includes a high-pass filter HPF, a rectifier circuit, a first comparator, a low-pass filter LPF, and a second comparator. An output from the second comparator is input into a logic section 223.

The logic section 223 outputs a relay switching signal to a relay driving circuit 224 through a CN2 (227). The CN2 (227) on the right side of the logic section 223 is the same as a CN2 (227) in the relay driving circuit 224.

The relay driving circuit 224 switches the relays RY1 and RY2 in accordance with the signal output from the logic section 223. An external power supply 225 supplies a voltage VCC to each section.

The first comparator, low-pass filter, second comparator, and logic section can be formed as a one-chip microcomputer.

Figure 23:
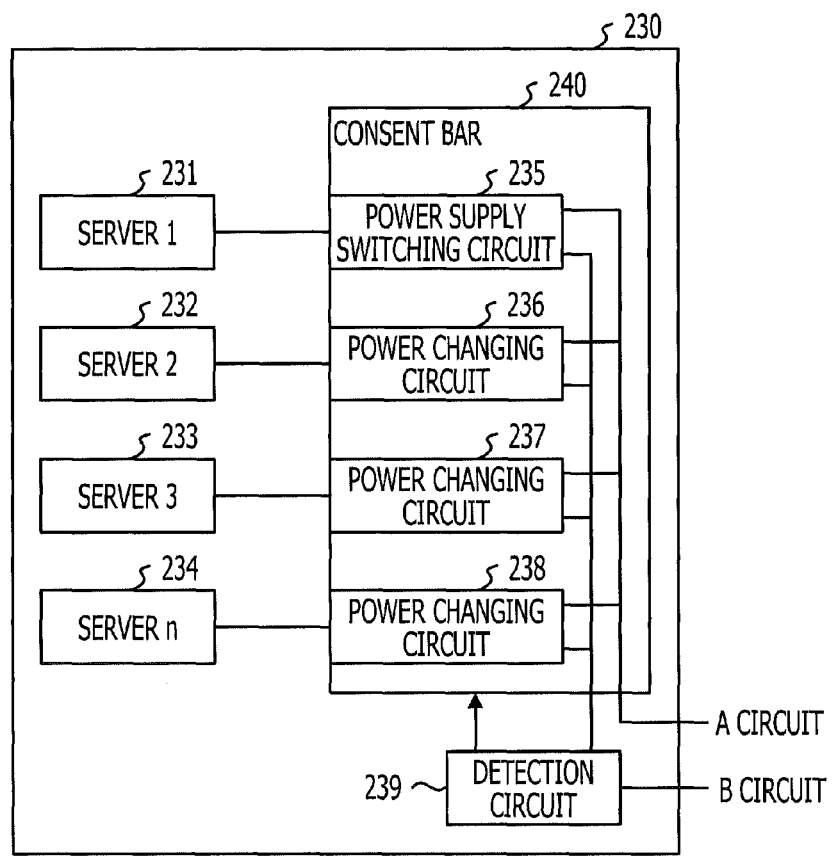
FIG. 23 illustrates an example of an application of the power supply switching apparatus.
Figure 24:
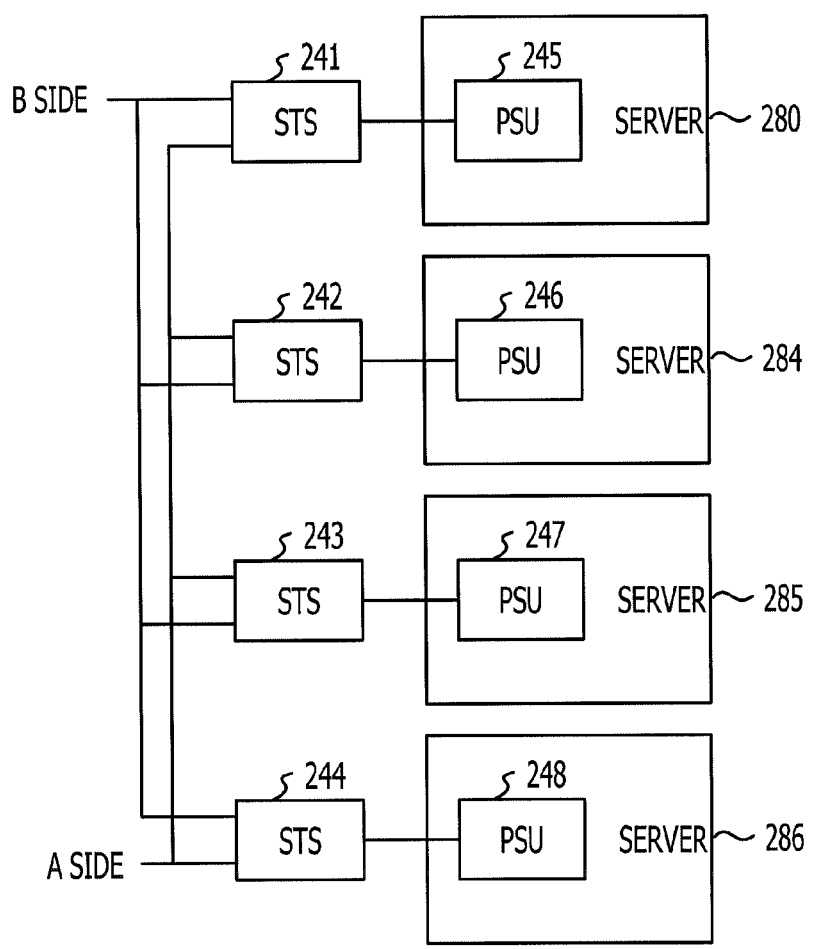
FIG. 24 illustrates an example of a server system that uses STSs.
Figure 25:
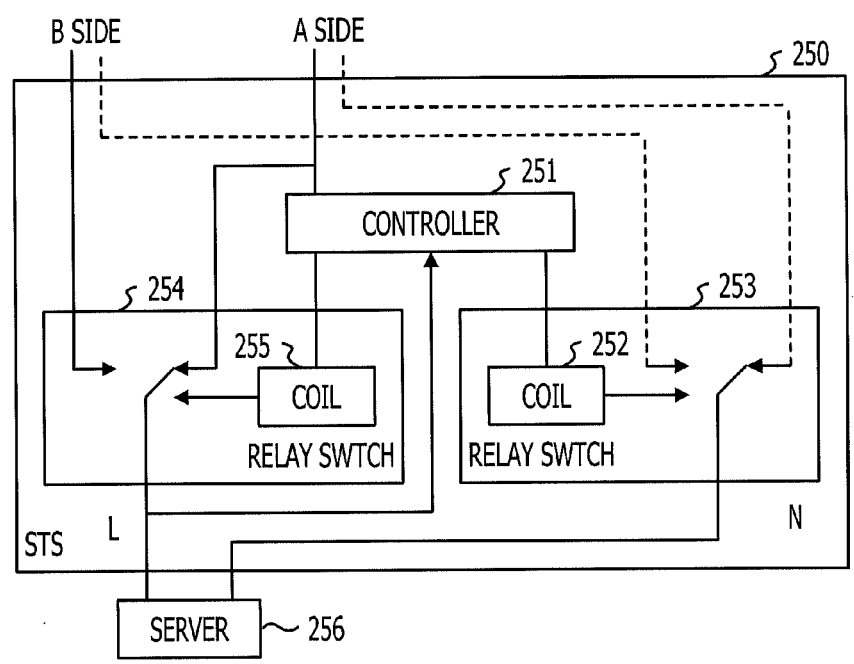
FIG. 25 illustrates a schematic configuration of an STS.

FIG. 23 illustrates an application of the power supply switching apparatus according to the embodiment.

FIG. 23 illustrates an example in which n servers are mounted in a server rack 230. The server rack 230 houses an outlet bar 240. The server rack 230 is connected to two power supply circuits of an A circuit and a B circuit.

The server rack 230 also houses a detection circuit 239 configured to detect a voltage of the B circuit illustrated in the bottom in FIG. 23. The outlet bar 240 includes power supply switching circuits 235 to 238 according to the present embodiment. The power supply switching circuits 235 to 238 correspond to the respective servers. The detection circuit 239 is connected to the power supply switching circuits 235 to 238 and outputs a switching signal to each of the power supply switching circuits 235 to 238 in accordance with a result of detection of a voltage of the B circuit.

Housing the power supply switching circuits 235 to 238 and the detection circuit 239 in the server rack 230 enables a reduction in the distance from the detection circuit 239 and the power supply switching circuits 235 to 238 to each server.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply switching apparatus for switching a power supply for supplying power to a load between a first power supply and a second power supply, the power supply switching apparatus comprising:
a controller including
a first comparator connected to either one of the first power supply and the second power supply, and configured to output a binary signal having a level corresponding to a magnitude of a signal input from the power supply being connected thereto,
an integrator circuit configured to integrate an output from the first comparator, and
a second comparator configured to output a binary signal having a level corresponding to a magnitude of a single input from the integrator circuit; and
a switch having an input side connected to the first power supply and the second power supply, and configured to switch an outputting current between a current supplied from the first power supply and a current supplied from the second power supply in accordance with a value of the signal output from the second comparator
wherein the power supply switching apparatus is connected to an alternating-current power supply, the controller further includes a rectifier circuit configured to rectify an input signal, and a high-pass filter configured to reduce a frequency component at or below a specific frequency in the signal rectified by the rectifier circuit, and the first comparator receives an output from the high-pass filter.

2. The power supply switching apparatus according to claim 1, further comprising: a power supply device configured to supply operating power for use in the power supply switching apparatus, wherein the power supply device is connected to an output of the switch, and the power is supplied through the output of the switch.

3. A power supply switching apparatus for switching a power supply for supplying power to a load between a first power supply and a second power supply, the power supply switching apparatus comprising:
- a controller including an adjusting unit connected to one of the first power supply and the second power supply and configured to adjust a level of a signal input from the power supply being connected thereto,
  an integrating unit configured to integrate a signal output from the adjusting unit, and
  a third comparator configured to output a binary signal having a level corresponding to a magnitude of a single output from the integrating unit; and
- a switch including
- a mechanical relay having an input side connected to the first power supply and the second power supply and configured to switch an outputting current between a current supplied from the first power supply and a current supplied from the second power supply in accordance with an input control signal, and
- a relay driver configured to output the input control signal to the mechanical relay, the input control signal instructing the mechanical relay to switch the outputting current in accordance with the binary signal from the third comparator
- wherein the controller further includes a fourth comparator disposed before the integrating unit and configured to output a binary signal having a level corresponding to a magnitude of an input signal,
- wherein the first power supply or the second power supply connected to the controller is an alternating-current power supply, the controller further includes a rectifying unit configured to rectify an input signal, and a high-pass filter configured to reduce a frequency component at or below a specific frequency in the signal rectified by the rectifying unit, the rectifying unit and the high-pass filter being disposed after the adjusting unit, and the fourth comparator receives an output from the high-pass filter.

4. The power supply switching apparatus according to claim 3, further comprising: a power supply device configured to supply operating power for use in the controller, wherein the power supply device receives a current output from the mechanical relay in the switch to the load.

5. The power supply switching apparatus according to claim 4, further comprising: a line filter on a connection line between the power supply device and the mechanical relay.

* * * * *